US012284878B2

(12) United States Patent
Jin

(10) Patent No.: US 12,284,878 B2
(45) Date of Patent: Apr. 22, 2025

(54) DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Meng Jin, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/607,855

(22) PCT Filed: Sep. 18, 2021

(86) PCT No.: PCT/CN2021/119313
§ 371 (c)(1),
(2) Date: Oct. 29, 2021

(87) PCT Pub. No.: WO2023/035317
PCT Pub. Date: Mar. 16, 2023

(65) Prior Publication Data
US 2024/0032346 A1    Jan. 25, 2024

(30) Foreign Application Priority Data
Sep. 8, 2021   (CN) .......................... 202111049374.9

(51) Int. Cl.
*H10K 59/122*    (2023.01)
*H10K 59/80*    (2023.01)

(52) U.S. Cl.
CPC ......... *H10K 59/122* (2023.02); *H10K 59/878* (2023.02)

(58) Field of Classification Search
None
See application file for complete search history.

(56) References Cited

U.S. PATENT DOCUMENTS 10,734,452 B1 *   8/2020   Kim .................... H10K 59/40
2014/0354142 A1 * 12/2014   Jeong ................. H10K 59/122
                                                          313/506

FOREIGN PATENT DOCUMENTS

CN         109216581 A         1/2019
CN         111063720 A         4/2020
(Continued)

OTHER PUBLICATIONS

Zhu et al., CN 108231824, An Oled Display Panel and a Preparation Method Thereof, Jun. 29, 2018 (Year: 2018).*
(Continued)

*Primary Examiner* — Alexander G Ghyka
(74) *Attorney, Agent, or Firm* — PV IP PC; Wei Te Chung

(57) ABSTRACT

A display panel includes a first display area. The first display area includes a display substrate and an optical layer. The display substrate includes a pixel defining layer and a cathode layer disposed on the pixel defining layer. The pixel defining layer includes a plurality of pixel openings and a plurality of supporting portions each disposed between two adjacent pixel openings. A thickness of a part of the cathode layer on each of the pixel opening is greater than a thickness of a part of the cathode layer on each of the supporting portions. The optical layer is disposed on the cathode layer and includes a plurality of first optical structures corresponding to the supporting portions. Each of the first optical structures includes a first surface close to the cathode layer, a second surface opposite to the first surface, and a side surface that is a total reflective surface.

17 Claims, 5 Drawing Sheets

(56) References Cited

FOREIGN PATENT DOCUMENTS

| | | | |
|---|---|---|---|
| CN | 111446379 | A | 7/2020 |
| CN | 113054133 | A | 6/2021 |
| CN | 113054134 | A | 6/2021 |
| CN | 113054136 | A | 6/2021 |
| CN | 113130613 | A | 7/2021 |
| CN | 113178530 | A | 7/2021 |
| CN | 113629208 | A | 11/2021 |

OTHER PUBLICATIONS

International Search Report in International application No. PCT/CN2021/119313, mailed on Jun. 8, 2022.
Written Opinion of the International Search Authority in International application No. PCT/CN2021/119313, mailed on Jun. 8, 2022.
Chinese Office Action issued in corresponding Chinese Patent Application No. 202111049374.9 dated Jun. 28, 2022, pp. 1-12.

* cited by examiner

DISPLAY PANEL

RELATED APPLICATIONS

This application is a National Phase of PCT Patent Application No. PCT/CN2021/119313 having international filing date of Sep. 18, 2021, which claims the benefit of priority of Chinese Patent Application No. 202111049374.9 filed on Sep. 8, 2021. The contents of the above applications are all incorporated by reference as if fully set forth herein in their entirety.

FIELD OF INVENTION

The present disclosure relates to the technical field of display, and particularly to a display panel.

BACKGROUND

Organic light-emitting diode (OLED) display technology has received more and more attention from scientific researchers, and has been widely applied in the field of display such as mobile phones, flat panels, and televisions. With the rapid development of display devices, users have higher and higher requirements for screen-to-body ratios of display devices, so that large-size and high-resolution full-screen display devices become a future development direction.

In the prior art, in order to increase screen-to-body ratios as much as possible, optical components such as front cameras and facial recognition devices are usually disposed under screens. However, in a current OLED full-screen display device, a cathode electrode is disposed on an entire surface of the current OLED full-screen display device. The cathode electrode has a low light transmittance, so that optical components disposed under a screen cannot receive sufficient light signals, which affects normal operations of the optical components.

SUMMARY OF DISCLOSURE

The present disclosure provides a display panel that can solve the problem that optical components disposed under screens cannot receive sufficient light signals, which affects normal operations of the optical components.

In order to solve the aforementioned problem, the present disclosure provides the following technical solutions.

The present disclosure provides a display panel comprising a first display area and a second display area surrounding the first display area. A light transmittance of the first display area is greater than a light transmittance of the second display area. The first display area comprises:
  a display substrate comprising a pixel defining layer and a cathode layer disposed on the pixel defining layer, wherein the pixel defining layer comprises a plurality of pixel openings spaced apart from each other and a plurality of supporting portions each disposed between two adjacent pixel openings, and a thickness of a part of the cathode layer on each of the pixel openings is greater than a thickness of a part of the cathode layer on each of the supporting portions; and
  an optical layer disposed on a side of the cathode layer away from the pixel defining layer, and comprising a plurality of first optical structures corresponding to the supporting portions, wherein each of the first optical structures comprises a first surface close to the cathode layer, a second surface opposite to the first surface, and a side surface that is a total reflective surface.

Optionally, in some embodiments, the optical layer further comprises at least two optical sub-layers with different refractive indices, and at least one of the at least two optical sub-layers forms the first optical structures.

Optionally, in some embodiments, the refractive indices of the at least two optical sub-layers decrease sequentially from a side close to the display substrate to a side away from the display substrate. A width of the second surfaces of the first optical structures is greater than or equal to a width of the first surfaces of the first optical structures.

Optionally, in some embodiments, the optical layer further comprises a plurality of second optical structures corresponding to the pixel openings. The second optical structures are disposed in a same layer as the first optical structures. Each of the second optical structures comprises a first surface close to the cathode layer, a second surface opposite to the first surface, and a side surface that is a total reflective surface.

Optionally, in some embodiments, a width of the second surfaces of the second optical structures is greater than or equal to a width of the first surfaces of the second optical structures.

Optionally, in some embodiments, the first optical structures and/or the second optical structures comprise at least two of the at least two optical sub-layers. One optical sub-layer on the side away from the display substrate covers one optical sub-layer on the side close to the display substrate. The at least two optical sub-layers in the first optical structures and/or the second optical structures have a same cross-sectional shape in a direction perpendicular to the display substrate.

Optionally, in some embodiments, the cathode layer comprises a plurality of first cathode portions corresponding to the pixel openings and a plurality of second cathode portions corresponding to the supporting portions, and a thickness of the first cathode portions is greater than a thickness of the second cathode portions.

Optionally, in some embodiments, the display substrate further comprises a plurality of anode electrodes, a first auxiliary layer, an organic light-emitting layer, a second auxiliary layer, and a cathode suppression layer. The anode electrodes are disposed corresponding to the first cathode portions. The first auxiliary layer is disposed on a side of each of the anode electrodes close to the cathode layer. The organic light-emitting layer is disposed on a side of the first auxiliary layer close to the cathode layer. The second auxiliary layer is disposed on a side of the organic light-emitting layer close to the cathode layer. The cathode suppression layer is disposed on each of the supporting portions. A thickness of the cathode suppression layer is less than a thickness of the cathode layer. An adhesion force between the cathode suppression layer and the cathode layer is less than an adhesion force between the cathode layer and the second auxiliary layer. The cathode suppression layer is made of a transparent material.

Optionally, in some embodiments, an orthographic projection of the cathode suppression layers on the optical layer is separated from an orthographic projection of the anode electrodes on the optical layer.

Optionally, in some embodiments, an orthographic projection of the first optical structures on the display substrate overlaps with the cathode suppression layers.

Optionally, in some embodiments, a boundary of the first surface of each of the first optical structures corresponds to a boundary of one corresponding cathode suppression layer.

Optionally, in some embodiments, an orthographic projection of the second optical structures on the display substrate overlaps with the first cathode portions.

Optionally, in some embodiments, a width of the pixel openings is L, and a height of the pixel openings is H. An included angle between the side surface and the first surface of each of the first optical structures is a first included angle, and an included angle between the side surface and the first surface of each of the second optical structures is a second included angle. The first included angle and the second included angle are both greater than a threshold angle and less than or equal to 90°, and the threshold angle is arctan (H/L)*180°/π.

Optionally, in some embodiments, the first included angle is equal to the second included angle.

Optionally, in some embodiments, a boundary of the first surface of each of the second optical structures is located between a boundary of one corresponding pixel opening and a boundary beyond the boundary of the corresponding pixel opening by a predetermined distance, and the predetermined distance is a vertical distance from the pixel defining layer to the optical layer divided by a tangent value of the threshold angle.

Optionally, in some embodiments, the refractive indices of the at least two optical sub-layers increase sequentially from a side of the optical layer close to the display substrate to a side of the optical layer away from the display substrate. A width of the second surfaces of the first optical structures is less than or equal to a width of the first surfaces of the first optical structures.

Optionally, in some embodiments, the cathode layer comprises a plurality of first cathode portions corresponding to the pixel openings and a plurality of second cathode portions corresponding to the supporting portions, and a thickness of the first cathode portions is greater than a thickness of the second cathode portions.

Optionally, in some embodiments, the display substrate further comprises a plurality of anode electrodes, a first auxiliary layer, an organic light-emitting layer, a second auxiliary layer, and a cathode suppression layer. The anode electrodes are disposed corresponding to the first cathode portions. The first auxiliary layer is disposed on a side of each of the anode electrodes close to the cathode layer. The organic light-emitting layer is disposed on a side of the first auxiliary layer close to the cathode layer. The second auxiliary layer is disposed on a side of the organic light-emitting layer close to the cathode layer. The cathode suppression layer is disposed on each of the supporting portions. A thickness of the cathode suppression layer is less than a thickness of the cathode layer. An adhesion force between the cathode suppression layer and the cathode layer is less than an adhesion force between the cathode layer and the second auxiliary layer. The cathode suppression layer is made of a transparent material.

Optionally, in some embodiments, the first display area further comprises a plurality of light-transmitting areas each disposed between two adjacent pixel openings. An orthographic projection of each of the first optical structures on the display substrate is located between one of the pixel openings and one of the light-transmitting areas.

Optionally, in some embodiments, a side of the first surface of each of the first optical structures close to one adjacent pixel opening corresponds to a side of the adjacent pixel opening, and a side of the first surface of each of the first optical structures close to one adjacent light-transmitting area corresponds to a side of the adjacent cathode suppression layer.

In the display panel provided by the present disclosure, the cathode layer is patterned so that a part of the cathode layer corresponding to the supporting portions is thinner or there is no cathode layer deposited, which greatly improves a light transmittance of the first display area. Furthermore, the optical layer is disposed above a light-emitting surface of the display substrate. The optical layer comprises the first optical structures each disposed between two adjacent pixel openings. The first optical structures can reflect more external light into the first display area of the display panel, thereby further increasing an amount of light incident in the first display area. Therefore, optical components disposed in the first display area can receive sufficient light signals, thereby improving performances of the components.

BRIEF DESCRIPTION OF DRAWINGS

Specific implementation of the present disclosure will be described in detail below in conjunction with accompanying drawings to make technical solutions and beneficial effects of the present disclosure obvious.

DETAILED DESCRIPTION

Figure 1:
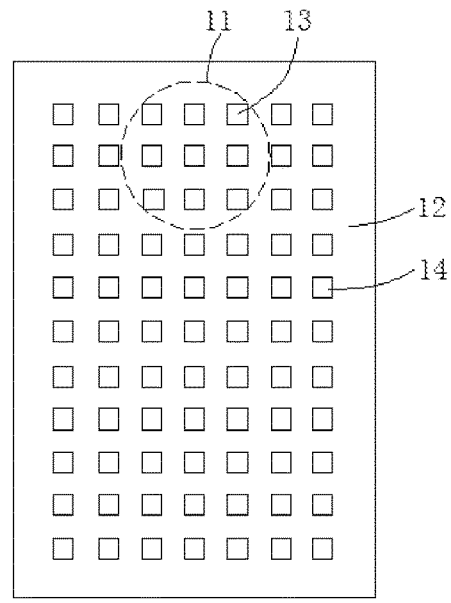
FIG. 1 is a schematic plan view of a display panel according to an embodiment of the present disclosure.

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within claimed scope of the present disclosure. In addition, it should be understood that specific embodiments described herein are only used to illustrate and explain the present invention, and are not used to limit the present invention. In the present disclosure, unless otherwise stated, directional terms used herein specifically indicate directions of the accompanying drawings. For example, directional terms "upper" and "lower" generally refer to upper and lower positions of a device in actual use or working conditions, and directional terms "inside" and "outside" refer to positions relative to a profile of the device.

Reference numerals and/or letters may be repeated in different examples of the present disclosure. Such repetitions are for simplicity and clarity, which per se do not indicate relations among the discussed embodiments and/or settings.

The following embodiments of the present disclosure can solve the problem that optical components disposed under screens cannot receive sufficient light signals, which affects normal operations of the optical components.

Please refer to FIG. 1, the present disclosure provides a display panel comprising a first display area 11 and a second display area 12. The second display area 12 surrounds the first display area 11. The first display area 11 may be disposed at any position on the display panel.

The display panel is a full-screen display panel. The first display area 11 is provided with a plurality of first sub-pixels 13. The second display area 12 is provided with a plurality of second sub-pixels 14.

It should be noted that the first display area 11 is a function additional area. The first display area 11 is configured to display images, so that the display panel displays in full screen. The first display area 11 is also configured to install optical components such as a camera, an optical touch component, and a fingerprint recognition sensor, thereby improving user experience. The second display area 12 is a main display area. The second display area 12 is configured to display images.

In an embodiment, a light transmittance of the first display area 11 is greater than a light transmittance of the second display area 12.

It is understandable that the light transmittance of the first display area 11 has a great influence on works of the optical components. The light transmittance of the first display area 11 is related to a layer structure of the first display area 11. Taking a camera as an optical component as an example, the higher the light transmittance of the first display area 11, the better the imaging quality of the camera when the camera is shooting.

Please refer to FIG. 2 to FIG. 10, the first display area 11 of the display panel comprises a display substrate 100 and an optical layer 200. The display substrate 100 has a light-emitting surface. The optical layer 200 is disposed above the light-emitting surface of the display substrate 100.

The display substrate 100 comprises a pixel defining layer 1031 and a cathode layer 1034 disposed on the pixel defining layer 1031. The pixel defining layer 1031 comprises a plurality of pixel openings 1001 spaced apart from each other and a plurality of supporting portions 1031a each disposed between two adjacent pixel openings 1001. A thickness of a part of the cathode layer 1034 on each of the pixel openings 1001 is greater than a thickness of a part of the cathode layer 1034 on each of the supporting portions 1031a. When the thickness of the part of the cathode layer 1034 on each of the supporting portions 1031a is 0, that is, no cathode layer is deposited between any two corresponding pixel openings 1001.

Furthermore, the first display area 11 further comprises a plurality of light-transmitting areas 111 each disposed between two adjacent pixel openings 1001. The light-transmitting areas 111 are configured to allow external light to pass through the display panel to the optical components. The thickness of the part of the cathode layer 1034 on each of the pixel openings 1001 is greater than a thickness of a part of the cathode layer 1034 in each of the light-transmitting areas 111.

Furthermore, the optical layer 200 comprises a plurality of first optical structures 200a each correspondingly disposed between two adjacent pixel openings 1001. Each of the first optical structures 200a comprises a first surface close to the cathode layer 1034, a second surface opposite to the first surface, and a side surface 200a'. The side surfaces 200a' of the first optical structures 200a are total reflective surfaces.

In the present disclosure, a portion of the cathode layer 1034 in the first display area 11 is patterned, so that the part of the cathode layer 1034 on each of the supporting portions 1031a disposed between two corresponding pixel openings 1001 is thinner or there is no cathode layer deposited, thereby improving the light transmittance of the first display area 11. Furthermore, in the present disclosure, the optical layer 200 is disposed above the light-emitting surface of the display substrate 100. In the optical layer 200, light is totally reflected on the side surfaces 200a' of the first optical structures 200a. Therefore, external light emitted to outsides of the light-transmitting areas 111 is reflected into the light-transmitting areas 111 through the side surfaces 200a' of the first optical structures 200a, so as to further increase an amount of light incident in the first display area 11. Therefore, the optical components disposed in the first display area 11 can receive sufficient light signals, thereby improving performances of the optical components.

Please refer to the following embodiments for details. It should be noted that a description order of the following embodiments is not intended to limit a preferred order of the embodiments.

First Embodiment

Figure 2:
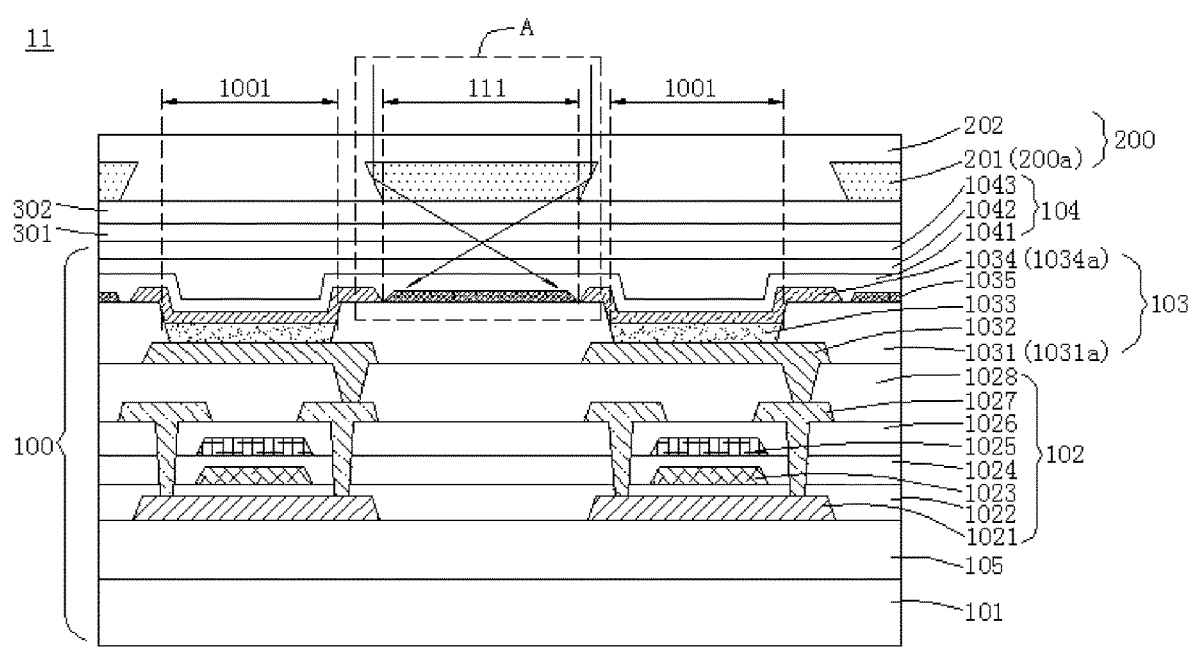
FIG. 2 is a schematic cross-sectional view of a first display area of a display panel according to a first embodiment of the present disclosure.

Please refer to FIG. 2, in this embodiment, a first display area 11 of a display panel comprises a display substrate 100 and an optical layer 200 disposed above a light-emitting surface of the display substrate 100. The optical layer 200 comprises a first optical sub-layer 201 and a second optical sub-layer 202. The second optical sub-layer 202 is disposed on a side of the first optical sub-layer 201 away from a base substrate 101. A refractive index of the first optical sub-layer 201 is greater than a refractive index of the second optical sub-layer 202.

Exemplarily, the refractive index of the first optical sub-layer 201 is 1.5-2, for example, it may be 1.5, 1.7, 1.8, or 2. The refractive index of the second optical sub-layer 202 is 1-1.4, for example, it may be 1, 1.1, 1.2, 1.3, or 1.4.

In this embodiment, the first optical sub-layer 201 forms a plurality of first optical structures 200a. The display substrate 100 comprises a pixel defining layer 1031 and a cathode layer 1034 disposed on the pixel defining layer 1031. The pixel defining layer 1031 comprises a plurality of pixel openings 1001 spaced apart from each other and a plurality of supporting portions 1031a each disposed between two adjacent pixel openings 1001. The first optical structures 200a are correspondingly disposed on the supporting portions 1031a each disposed between two adjacent pixel openings 1001.

In other embodiments, the first optical structures 200a may be formed from the second optical sub-layer 202. At this time, portions of the first optical sub-layer 201 corresponding to the first optical structures 200a need to be provided with recesses that match the first optical structures 200a. The first optical structures 200a are embedded in the recesses.

In an embodiment, the optical layer 200 is a transparent layer.

Figure 3:
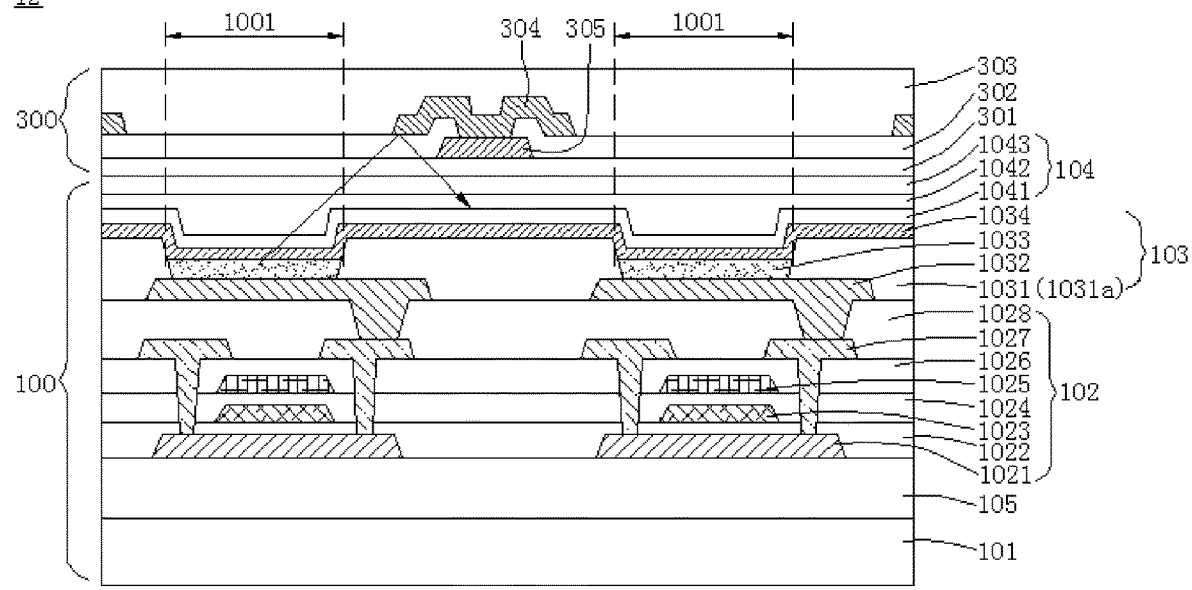
FIG. 3 is a schematic cross-sectional view of a second display area of the display panel according to the first embodiment of the present disclosure.

Please refer to FIG. 3, in this embodiment, a second display area 12 of the display panel comprises the display substrate 100 and a touch layer 300. The touch layer 300 is disposed above the light-emitting surface of the display substrate 100. The touch layer 300 comprises a first insulating layer 301, a second insulating layer 302, a third insulating layer 303, a plurality of touch electrodes 304, and a plurality of touch electrode connecting wires 305. The first insulating layer 301 is disposed on a surface of the display substrate 100. The touch electrode connecting wires 305 are disposed on a side of the first insulating layer 301 away from the display substrate 100. The second insulating layer 302 is disposed on sides of the touch electrode connecting wires 305 away from the display substrate 100. The touch electrodes 304 are disposed on a side of the second insulating layer 302 away from the display substrate 100. The third insulating layer 303 is disposed on sides of the touch electrodes 304 away from the display substrate 100.

The display substrate 100 comprises the pixel defining layer 1031 and the cathode layer 1034 disposed on the pixel defining layer 1031. The pixel defining layer 1031 comprises the pixel openings 1001 spaced apart from each other and the supporting portions 1031a each disposed between two adjacent pixel openings 1001. Each of the touch electrodes 304 and the touch electrode connecting wires 305 is correspondingly disposed between two adjacent pixel openings 1001. Each of portions of the second insulating layer 302 corresponding to the touch electrode connection wires 305 is provided with a via hole penetrating the second insulating layer 302. When the touch layer 300 is a mutual capacitive touch layer, each of the touch electrodes 304 comprises a first electrode and a second electrode that form a mutual capacitance. Two adjacent first electrodes or two adjacent second electrodes are electrically connected by one corresponding touch electrode connection wire 305 through one corresponding via hole.

As shown in FIG. 2 and FIG. 3, in this embodiment, the display substrate 100 comprises the base substrate 101, a thin-film transistor (TFT) device layer 102, an organic light-emitting display (OLED) device layer 103, and a thin film encapsulation layer 104.

The base substrate 101 may be a flexible base substrate. The flexible base substrate may be made of organic materials such as polyimide. The base substrate 101 may also be a rigid base substrate. For example, the rigid base substrate may be made of glass, metal, plastic, etc. The base substrate 101 may have a single-layer structure or a multi-layer structure.

The TFT device layer 102 is disposed above the base substrate 101. The display substrate 100 further comprises a buffer layer 105 between the TFT device layer 102 and the base substrate 101. The buffer layer 105 is made of silicon oxide or silicon nitride that can block water and oxygen. The TFT device layer 102 comprises an active layer 1021, a first gate insulating layer 1022 covering the active layer 1021, a plurality of first gate electrodes 1023 disposed on a side of the first gate insulating layer 1022 away from the base substrate 101, a second gate insulating layer 1024 covering the first gate electrodes 1023, a plurality of second gate electrodes 1025 disposed on a side of the second gate insulating layer 1024 away from the base substrate 101, an interlayer dielectric layer 1026 covering the second gate electrodes 1025, a plurality of source/drain electrodes 1027 disposed on a side of the interlayer dielectric layer 1026 away from the base substrate 101, and a planarization layer 1028 covering the source/drain electrodes 1027.

The OLED device layer 103 is disposed on a side of the TFT device layer 102 away from the base substrate 101. The OLED device layer 103 comprises the pixel defining layer 1031, a plurality of anode electrodes 1032, a plurality of organic light emitting layers 1033, and a cathode layer 1034. The pixel defining layer 1031 defines the pixel openings 1001. The organic light emitting layers 1033 are disposed corresponding to the pixel openings 1001. The organic light emitting layers 1033 are disposed between the anode electrodes 1032 and the cathode layer 1034. The anode electrodes 1032 are disposed on a side of the cathode layer 1034 away from the optical layer 200.

The thin film encapsulation layer 104 is disposed on a side of the OLED device layer 103 away from the base substrate 101. The thin film encapsulation layer 104 is configured to protect devices in the display panel from influence of water and oxygen, thereby prolonging a service life of the display panel. The thin film encapsulation layer 104 comprises a first inorganic layer 1041, a first organic layer 1042, and a second inorganic layer 1043. The first organic layer 1042 is disposed between the first inorganic layer 1041 and the second inorganic layer 1043. The first inorganic layer 1041 is disposed on a side of the first organic layer 1042 close to the base substrate 101. The second inorganic layer 1043 is disposed on a side of the first organic layer 1042 away from the base substrate 101.

A difference between a portion of the display substrate 100 in the first display area 11 and a portion of the display substrate 100 in the second display area 12 is as follows. In the second display area 12, the cathode layer 1034 is disposed as a whole layer without patterning, that is, its thickness remains uniform. In the first display area 11, the cathode layer 1034 is patterned to have different thicknesses. That is, the cathode layer 1034 comprises a plurality of first cathode portions 1034a corresponding to the pixel openings 1001 and a plurality of second cathode portions (not shown) corresponding to the supporting portions 1031a, and a thickness of the first cathode portions 1034a is greater than a thickness of the second cathode portions.

In this embodiment, the portion of the cathode layer 1034 in the first display area 11 is patterned into the first cathode portions 1034a, and the first cathode portions 1034a are disposed corresponding to the pixel openings 1001.

As shown in FIG. 2, in this embodiment, the first display area 11 further comprises a plurality of light-transmitting areas 111 each disposed between two adjacent pixel openings 1001. The light-transmitting areas 111 are configured to allow external light to pass through the display panel to optical components.

The display substrate 100 further comprises a plurality of first auxiliary layers (not shown) disposed between the anode electrodes 1032 and the organic light-emitting layers 1033, and a plurality of second auxiliary layers (not shown) disposed between the organic light-emitting layers 1033 and the first cathode portions 1034a. The first auxiliary layers may be hole transport layers. The second auxiliary layers may be electron transport layers.

The first display area 11 further comprises a plurality of cathode suppression layers 1035. The cathode suppression layers 1035 are disposed on the support portions 1031a. An orthographic projection of the cathode suppression layers 1035 on the optical layer 200 is separated from an orthographic projection of the anode electrodes 1032 on the optical layer 200, that is, does not overlap with the orthographic projection of the anode electrodes 1032 on the optical layer 200. Furthermore, an adhesion force between the cathode suppression layers 1035 and the cathode layer 1034 is less than an adhesion force between the cathode layer 1034 and the second auxiliary layers.

The cathode layer 1034 may be made of magnesium. The cathode suppression layers 1035 may be made of at least one of bis(2-methyl-8-hydroxyquinoline)-4-(p-phenylphenol)-aluminum (BAlq), 3-(4-biphenylyl)-4-phenyl-5-(4-tert-butylphenyl)-1,2,4-triazole (TAZ), and indium oxide (OTI). Magnesium has poor adhesion on BAlq, TAZ, and OTI. When magnesium is deposited to form the cathode layer 1034, the cathode suppression layers 1035 suppress magnesium from forming films on the cathode suppression layers 1035. Because the cathode suppression layers 1035 are made of a transparent material, a light transmittance of the first display area 11 is improved.

Furthermore, a boundary of each of the cathode suppression layers 1035 coincides with a boundary of one corresponding light-transmitting area 111.

In an embodiment, a thickness of the cathode suppression layers 1035 is not greater than a thickness of the cathode layers 1034.

Figure 4:
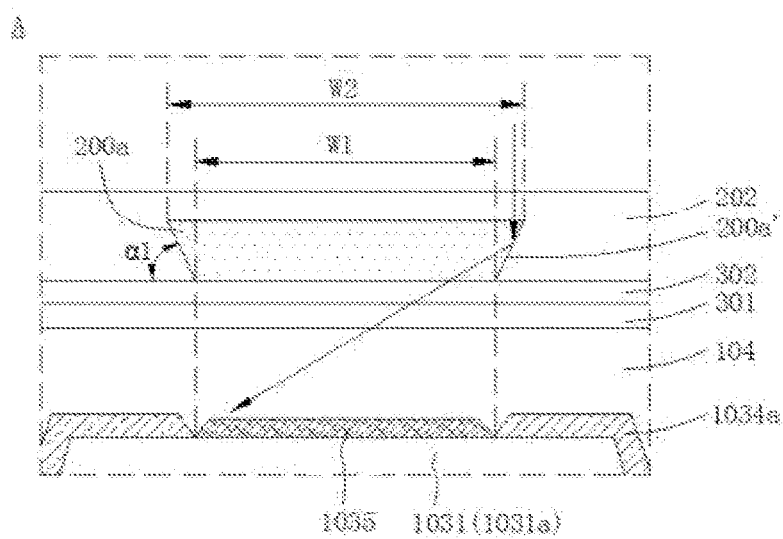
FIG. 4 is a partial enlarged view of a region A in FIG. 2.
Figure 5:
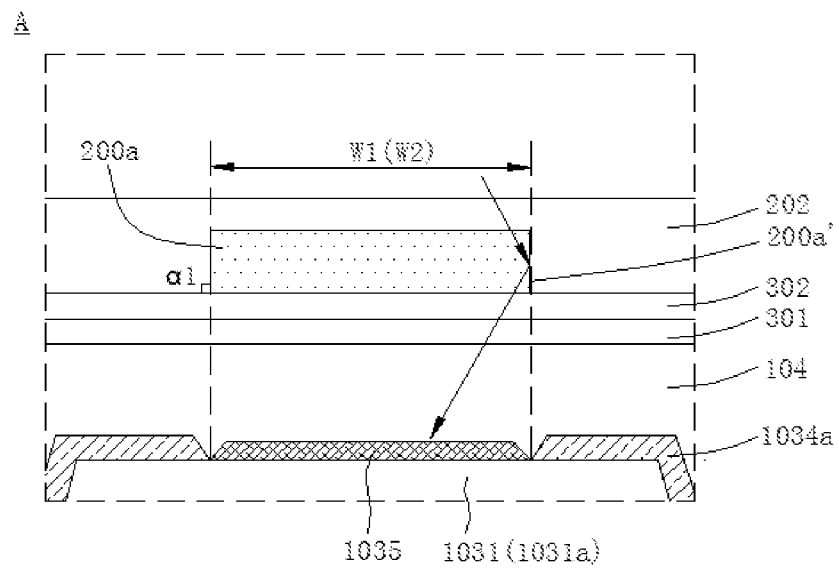
FIG. 5 is another partial enlarged view of the region A in FIG. 2.

As shown in FIG. 2, FIG. 4, and FIG. 5, a first included angle α1 between a side surface 200a' and a first surface of each of the first optical structures 200a is 0° to 90°. For example, the first included angle α1 is 15°, 30°, 45°, 60°, 70°, 80°, or 90°.

As shown in FIG. 4, an orthographic projection of the first optical structures 200a on the display substrate 100 overlaps with the cathode suppression layers 1035. Specifically, sides of the first optical structures 200a close to the thin film encapsulation layer 104 are bottoms, and a boundary of each of the bottoms corresponds to a boundary of one corresponding cathode suppression layer 1035. In a direction perpendicular to the display substrate 100, a cross-sectional width w2 of a side of each of the first optical structures 200a away from the display substrate 100 is greater than a cross-sectional width w1 of a side of each of the first optical structures 200a close to the display substrate 100. Because the refractive index of the second optical sub-layer 202 is less than a refractive index of the first optical structures 200a (that is, the first optical sub-layer 201), an interface (that is, the side surface 200a') between each of the first optical structures 200a and the second optical sub-layer 202 is a total reflective surface. When external light enters the first optical structures 200a, the external light directed to the side surfaces 200a' is totally reflected on inner surfaces of the side surfaces 200a', thereby changing a path of the external light. Therefore, the external light originally directed outside the light-transmitting areas 111 enters the light-transmitting areas 111 after being totally reflected, thereby increasing an amount of light incident in the light-transmitting areas 111 and increasing the light transmittance of the first display area 11.

As shown in FIG. 5, when the first included angle α1 between the side surface 200a' and the first surface of each of the first optical structures 200a is 90°, in the direction perpendicular to the display substrate 100, the cross-sectional width w2 of the side of each of the first optical structures 200a away from the display substrate 100 is equal to the cross-sectional width w1 of the side of each of the first optical structures 200a close to the display substrate 100. Because the external light is natural light, the external light can illuminate the side surfaces 200a' when the first included angle α1 is 90°. When the external light enters the first optical structures 200a, the external light directed to the side surfaces 200a' is totally reflected on inner surfaces of the side surfaces 200a', thereby changing the path of the external light. Therefore, the external light originally directed outside the light-transmitting areas 111 enters the light-transmitting areas 111 after being totally reflected, thereby increasing the amount of the light incident in the light-transmitting areas 111 and increasing the light transmittance of the first display area 11.

Please refer to FIG. 2 to FIG. 5. For convenience of production, the first display area 11 may share the first insulating layer 301, the second insulating layer 302, and the third insulating layer 303 in the second display area 12. That is, the second optical sub-layer 202 and the third insulating layer 303 may be a same layer.

In an embodiment, a thickness of the optical layer 200 is 1 μm to 3.5 μm. A thickness of the first optical sub-layer 201 is 0.2 μm to 1.5 μm. A thickness of the second optical sub-layer 202 is 1 μm to 2 μm.

In an embodiment, the side surface 200a' of each of the first optical structures 200a is an inclined surface or a curved surface.

Furthermore, when the side surface 200a' of each of the first optical structures 200a is a curved surface, a radius of curvature of the curved surface is 1.5 μm to 5 μm.

Second Embodiment

Figure 6:
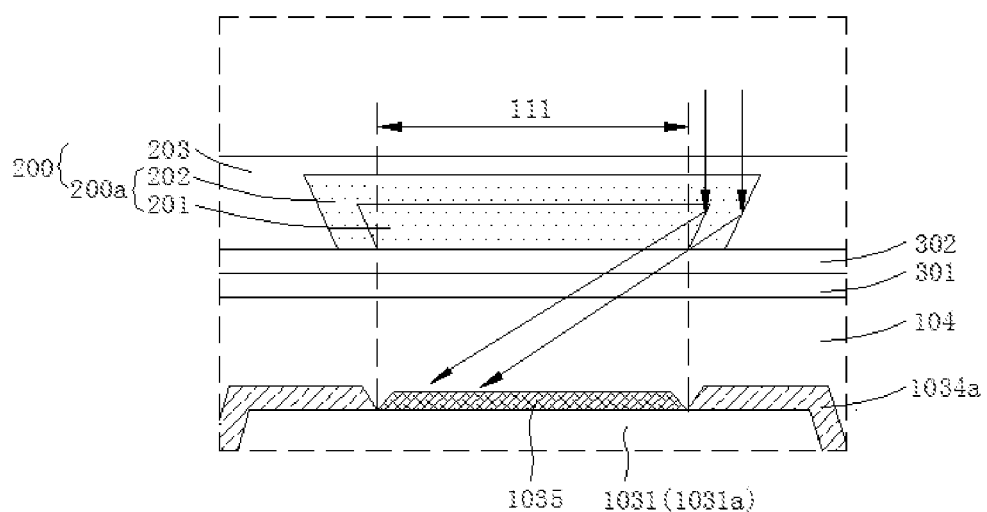
FIG. 6 is a partial schematic diagram of a display panel according to a second embodiment of the present disclosure.

Please refer to FIG. 2, FIG. 3, and FIG. 6, a structure of a display panel of this embodiment is similar to a structure of the display panel of the first embodiment. This embodiment differs from the first embodiment in that an optical layer 200 of the display panel of this embodiment comprises a plurality of optical sub-layers with different refractive indices, and at least two of the optical sub-layers form first optical structures 200a. Refractive indices of the optical sub-layers decrease sequentially from a side close to a display substrate 100 to a side away from the display substrate 100. One optical sub-layer on the side away from the display substrate 100 covers one optical sub-layer on the side close to the display substrate 100, and the at least two optical sub-layers in the first optical structures 200a have a same cross-sectional shape in a direction perpendicular to the display substrate 100.

Please refer to FIG. 6 for details. A region shown in FIG. 6 is equivalent to a region A in FIG. 2. For convenience of description, FIG. 6 only illustrates three optical sub-layers. The optical layer 200 comprises a first optical sub-layer 201, a second optical sub-layer 202, and a third optical sub-layer 203. A refractive index of the first optical sub-layer 201 is greater than a refractive index of the second optical sub-layer 202, and the refractive index of the second optical sub-layer 202 is greater than a refractive index of the third optical sub-layer 203. The first optical sub-layer 201 and the second optical sub-layer 202 constitute the first optical structures 200a, and the third optical sub-layer 203 covers the first optical structures 200a.

Each of the first optical structures 200a comprises two optical sub-layers, wherein the second optical sub-layer 202 covers the first optical sub-layer 201. For convenience of production, when forming the first optical sub-layer 201 and the second optical sub-layer 202, similar types of masks with different apertures may be used to pattern the first optical sub-layer 201 and the second optical sub-layer 202 to form the first optical sub-layer 201 and the second optical sub-layer 202 with different sizes but a same shape, which is not limited herein.

It is understandable that a side of each of the optical sub-layers in the first optical structures 200a close to the cathode suppression layer 1035 is a bottom, and a side of each of the optical sub-layers in the first optical structures 200a away from the cathode suppression layer 1035 is a top. A boundary of a bottom of the innermost optical sub-layer (such as the first optical sub-layer 201) in each of the first optical structures 200a corresponds to a boundary of one corresponding cathode suppression layer 1035 (that is, one corresponding light-transmitting area 111). A boundary of a top of the outermost optical sub-layer (such as the second optical sub-layer 202) in each of the first optical structures 200a is correspondingly located between a boundary of one adjacent cathode suppression layer 1035 and a boundary of one adjacent pixel opening 1001.

A structure of the display substrate 100 in the display panel of this embodiment is same as a structure of the display substrate 100 in the display panel of the first embodiment, and a structure of a second display area 12 of the display panel of this embodiment is same as a structure of the second display area 12 of the display panel of the first embodiment, which will not be described in detail herein.

In this embodiment, a side surface of each of the optical sub-layers in the first optical structures 200a may be formed as a total reflective surface. In this way, when external light enters the first optical structures 200a, the external light directed to the side surface of each of the optical sub-layers is totally reflected on an inner surface of the side surface of each of the optical sub-layers, thereby changing a path of the external light. Therefore, the external light originally directed outside light-transmitting areas 111 enters the light-transmitting areas 111 after being totally reflected, thereby increasing the amount of the light incident in the light-transmitting areas 111. Accordingly, compared with the first embodiment, this embodiment can further increase a light transmittance of a first display area 11.

Third Embodiment

Please refer to FIG. 3, FIG. 6, FIG. 7, and FIG. 8, a structure of a display panel of this embodiment is similar to the structure of the display panel of the first/second embodiment. A structure of a display substrate 100 in the display panel of this embodiment is same as a structure of the display substrate 100 in the display panel of the first embodiment, and a structure of a second display area 12 of the display panel of this embodiment is same as a structure of the second display area 12 of the display panel of the first embodiment, which will not be described in detail herein. This embodiment differs from the first/second embodiment in that in a first display area 11, an optical layer 200 further comprises a plurality of second optical structures 200b corresponding to pixel openings 1001. The second optical structures 200b are disposed in a same layer as a first optical structures 200a. Each of the second optical structures 200b comprises a first surface close to a cathode layer 1034, a second surface opposite to the first surface, and a side surface 200b'. An included angle between the side surface 200b' and the first surface of each of the second optical structures 200b is a second included angle α2. The second included angle α2 is 0° to 90°.

For example, the second included angle α2 is 15°, 30°, 45°, 60°, 70°, 80°, or 90°.

Figure 7:
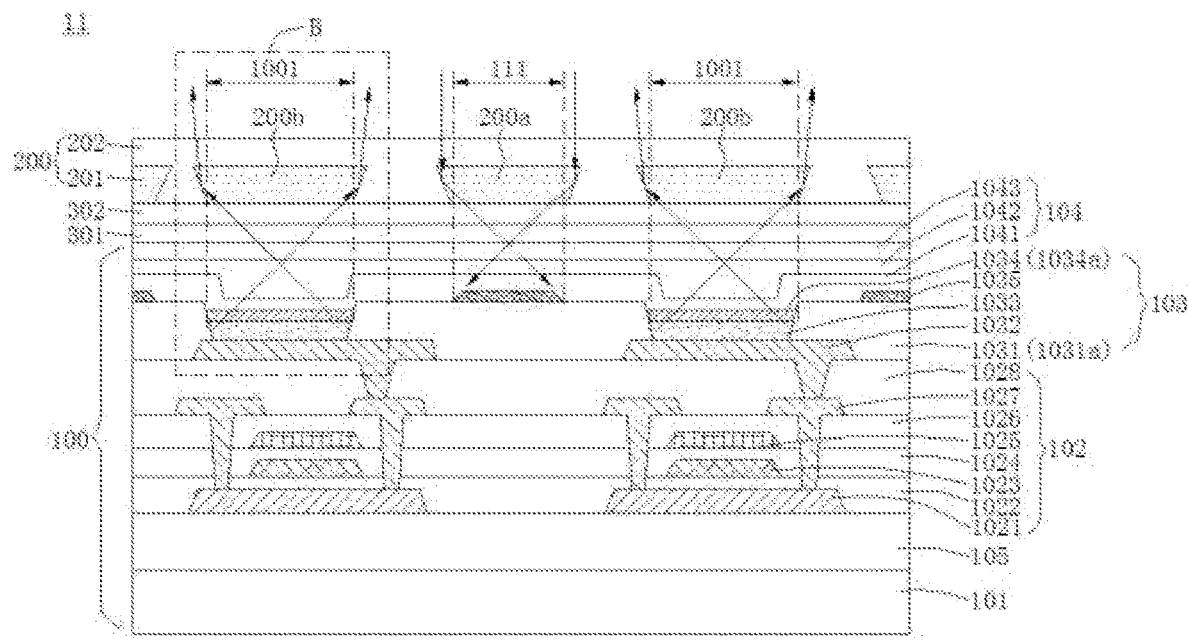
FIG. 7 is a schematic cross-sectional view of a first display area of a display panel according to a third embodiment of the present disclosure.

As shown in FIG. 7, an orthographic projection of the second optical structures 200b on the display substrate 100 overlaps with first cathode portions 1034a. A cross-sectional shape of each of the second optical structures 200b is same as or similar to a cross-sectional shape of each of the first optical structures 200a. In a direction perpendicular to the display substrate 100, a cross-sectional width of a side of each of the second optical structures 200b away from the display substrate 100 is greater than or equal to a cross-sectional width of a side of each of the second optical structures 200b close to the display substrate 100.

In an embodiment, sides of the second optical structures 200b close to a thin film encapsulation layer 104 are bottoms, and sides of the second optical structures 200b away from the thin film encapsulation layer 104 are tops. A boundary of the bottom of each of the second optical structures 200b corresponds to a boundary of one corresponding pixel opening 1001. A boundary of the top of each of the second optical structures 200b is located between a boundary of one adjacent pixel opening 1001 and a boundary of one adjacent light-transmitting area 111. Furthermore, the second optical structures 200b are disposed alternately with the first optical structures 200a.

As shown in FIG. 2 and FIG. 3, in the second display area 12 of the display panel, each of touch electrodes 304 and touch electrode connecting wires 305 of a touch layer 300 is generally disposed between two adjacent pixel openings 1001. Furthermore, the touch electrodes 304 and the touch electrode connecting wires 305 are made of a reflective and conductive metal. Therefore, a light emitted by organic light-emitting layers 1033 and directed between two adjacent pixel openings 1001 is reflected on surfaces of the touch electrodes 304 and the touch electrode connecting wires 305 (please refer to a light path shown in FIG. 3). That is, a light emitted from second sub-pixels 14 in the second display area 12 at a large viewing angle is blocked by the touch electrodes 304 and the touch electrode connecting wires 305. However, in the first display area 11, the touch electrodes 304 and the touch electrode connecting wires 305 are not disposed between two adjacent pixel openings 1001. Therefore, a light emitted from first sub-pixels 13 in the first display area 11 and directed between two adjacent pixel openings 1001 is not blocked. This results in a brightness difference between the first display area 11 and the second display area 12.

Figure 8:
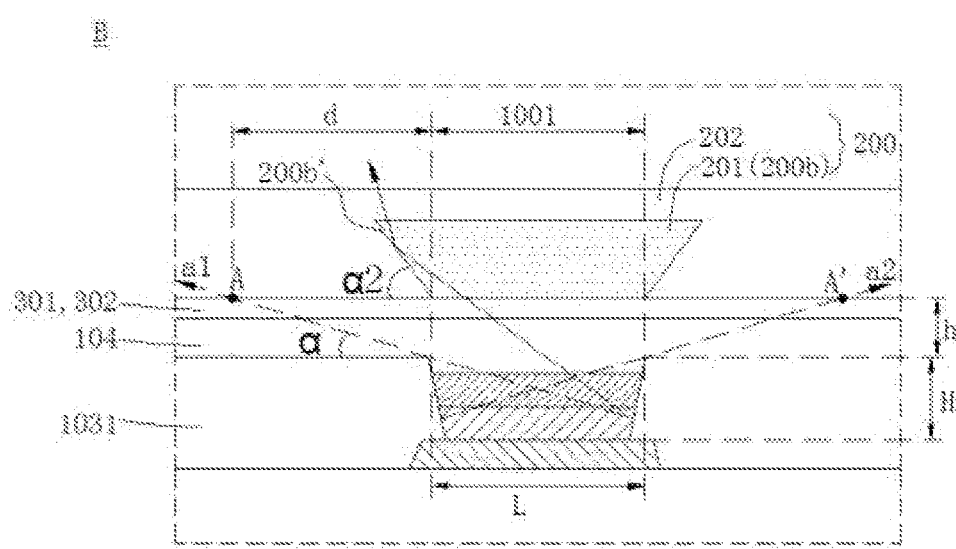
FIG. 8 is a partial enlarged view of a region B in FIG. 7.

In view of this technical problem, in this embodiment, the second optical structures 200b are disposed at positions of the first display area 11 corresponding to the pixel openings 1001. As shown in FIG. 7 and FIG. 8, because a refractive index of the second optical structures 200b (i.e. a first optical sub-layer 201) is greater than a refractive index of a second optical sub-layer 202, an interface (that is, the side surface 200a') between each of the second optical structures 200b and the second optical sub-layer 202 is a total reflective surface. When the light emitted by the organic light-emitting layers 1033 enters the second optical structures 200b, the light directed to the side surfaces 200b' is totally reflected on inner surfaces of the side surfaces 200b', thereby changing a path of the light. In this way, the light originally emitted at the large viewing angle shifts to a normal viewing angle direction after being totally reflected, thereby increasing an amount of light emitted in a normal direction in the first sub-pixels 13 and improving the brightness difference between the first display area 11 and the second display area 12.

In an embodiment, when the second included angle α2 between the side surface 200b' of each of the second optical structures 200b and a plane of the display substrate 100 is 90°, in the direction perpendicular to the display substrate 100, the cross-sectional width of the side of each of the second optical structures 200b away from the display substrate 100 is equal to the cross-sectional width of the side of each of the second optical structures 200b close to the display substrate 100. Similar to FIG. 5 in the first embodiment, when the light emitted from the first sub-pixels 13 enters the second optical structures 200b, the light directed to the side surfaces 200*b*' is totally reflected on the inner surfaces of the side surfaces 200*b*', thereby changing the path of the light. In this way, the light originally emitted at the large viewing angle shifts to the normal viewing angle direction after being totally reflected, thereby increasing the amount of the light emitted in the normal direction in the first sub-pixels 13 and improving the brightness difference between the first display area 11 and the second display area 12.

As shown in FIG. 8, theoretically, a minimum value of the second included angle α2 is limited by a width and height of the pixel openings 1001 formed from a pixel defining layer 1031. The width of the pixel openings 1001 is L, and the height of the pixel openings 1001 is H. The light emitted by the organic light-emitting layers 1033 disposed in the pixel openings 1001 has a certain viewing angle range after exiting the pixel openings 1001. Lights a1 and a2 are lights with a maximum angle emitted by the organic light emitting layers 1033 from an edge of the pixel defining layer 1031. It is understandable that when the second included angle α2 is greater than a threshold angle α between the lights (such as the lights a1 or a2) with the maximum angle and the plane of the display substrate 100, the light emitted by the organic light-emitting layers 1033 irradiates the side surfaces 200*b*' of the second optical structures 200*b*.

The threshold angle α is arctan(H/L)*180°/π.

In an embodiment, the second included angle α2 is greater than the threshold angle α, and less than or equal to 90°.

In an embodiment, in order to simplify a manufacturing process, the first included angle α1 and the second included angle α2 are same. That is, a shape and size of the first optical structures 200*a* and a shape and size of the second optical structures 200*b* are same.

In an embodiment, in order to maximize utilization of the second optical structures 200*b*, a boundary of a bottom of each of the second optical structures 200*b* close to the cathode layer 1034 is located between a boundary of one corresponding pixel opening 1001 and a boundary beyond the boundary of the corresponding pixel opening 1001 by a predetermined distance d. When the boundary of the bottom of each of the second optical structures 200*b* is located at an intersection (point A or point A') of the light (such as lights a1 or a2) with the maximum angle and the optical layer 200, the light with the maximum angle just irradiates a bottom of the side surface 200*b*' of one corresponding second optical structure 200*b*, and the light emitted from one corresponding organic light-emitting layer 1033 just irradiates the entire side surfaces 200*b*'.

The predetermined distance d is a vertical distance h from the pixel defining layer 1031 to the optical layer 200 divided by a tangent value of the threshold angle α.

In an embodiment, the side surface 200*b*' of each of the second optical structure 200*b* is an inclined surface or a curved surface.

Furthermore, when the side surface 200*b*' of each of the second optical structure 200*b* is a curved surface, a radius of curvature of the curved surface is 1.5 μm to 5 μm.

In FIG. 7, the first optical structures 200*a* and the second optical structures 200*b* have a single-layer structure of an optical sub-layer. It is understandable that in other embodiments, the first optical structures 200*a* and the second optical structures 200*b* may comprise at least two optical sub-layers with different refractive indices, and refractive indices of the optical sub-layers of the optical layer 200 decrease sequentially from a side close to the display substrate 100 to a side away from the display substrate 100. For example, the first optical structures 200*a* and the second optical structures 200*b* comprise at least two optical sub-layers, one optical sub-layer on the side away from the display substrate 100 covers one optical sub-layer on the side close to the display substrate 100, and the at least two optical sub-layers in the first optical structures 200*a* and the second optical structures 200*b* have a same cross-sectional shape in the direction perpendicular to the display substrate 100. For details, please refer to a design of the first optical structures 200*a* in the second embodiment and FIG. 6, which will not be described in detail herein. Adopting such a design can further increase a light transmittance of the first display area 11 and the amount of the light emitted in the normal direction in the first sub-pixels 13.

Compared with the first and second embodiments, in this embodiment, the second optical structures that can increase the amount of the light emitted in the normal direction are disposed above the pixel openings. Therefore, while increasing the light transmittance of the first display area, this embodiment can further increase the amount of the light emitted in the normal direction in the first sub-pixels in the first display area, thereby improving the brightness difference between the first display area and the second display area.

Fourth Embodiment

Figure 9:
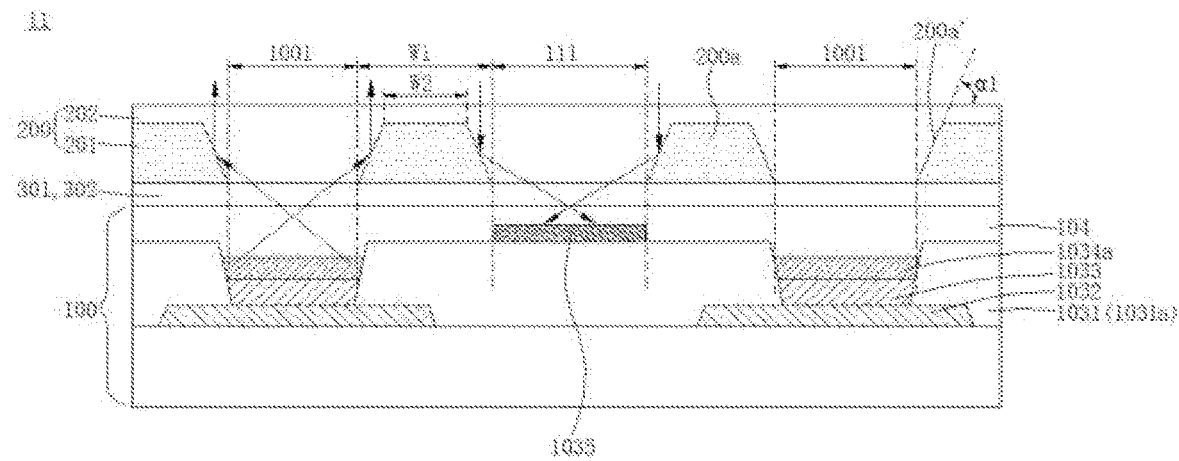
FIG. 9 is a schematic cross-sectional view of a first display area of a display panel according to a fourth embodiment of the present disclosure.

Please refer to FIG. 3 and FIG. 9, a structure of a display panel of this embodiment is similar to the structure of the display panel of the first embodiment. A structure of a display substrate 100 in the display panel of this embodiment is same as the structure of the display substrate 100 in the display panel of the first embodiment, and a structure of a second display area 12 of the display panel of this embodiment is same as the structure of the second display area 12 of the display panel of the first embodiment, which will not be described in detail herein. This embodiment differs from the first/second embodiment in that an optical layer 200 comprises a first optical sub-layer 201 and a second optical sub-layer 202, the second optical sub-layer 202 is disposed on a side of the first optical sub-layer 201 away from a base substrate 101, and a refractive index of the first optical sub-layer 201 is less than a refractive index of the second optical sub-layer 202.

Exemplarily, the refractive index of the first optical sub-layer 201 is 1-1.4, for example, it may be 1, 1.1, 1.2, 1.3, or 1.4. The refractive index of the second optical sub-layer 202 is 1.5-2, for example, it may be 1.5, 1.7, 1.8, or 2.

The first optical sub-layer 201 forms a plurality of first optical structures 200*a*. A pixel defining layer 1031 of the display substrate 100 comprises a plurality of pixel openings 1001 spaced apart from each other and a plurality of supporting portions 1031*a* each disposed between two adjacent pixel openings 1001. The first optical structures 200*a* are correspondingly disposed on the supporting portions 1031*a* each disposed between two adjacent pixel openings 1001. A surface of the display substrate 100 facing the first optical structures 200*a* is provided with a plurality of cathode suppression layers 1035. The cathode suppression layers 1035 are located on the supporting portions 1031*a* each disposed between two adjacent pixel openings 1001. A light-transmitting area 111 is provided between every two adjacent pixel openings 1001. Each of the cathode suppression layers 1035 is disposed corresponding to one light-transmitting area 111.

Furthermore, an orthographic projection of each of the first optical structures 200*a* on the display substrate 100 is located between one pixel opening 1001 and one cathode suppression layer 1035. In addition, in a direction perpendicular to the display substrate 100, a cross-sectional width w2 of a side of each of the first optical structures 200*a* away from the display substrate 100 is less than or equal to a cross-sectional width w1 of a side of each of the first optical structures 200*a* close to the display substrate 100.

In an embodiment, an orthographic projection of the first optical structures 200*a* on the display substrate 100 does not overlap with the cathode suppression layers 1035.

In an embodiment, a boundary of each of the first optical structures 200*a* is located between a boundary of one adjacent pixel opening 1001 and a boundary of one adjacent cathode suppression layer 1035.

Furthermore, sides of the first optical structures 200*a* close to the cathode suppression layers 1035 are bottoms, and sides of the first optical structures 200*a* away from the cathode suppression layers 1035 are tops. A side of the bottom of each of the first optical structures 200*a* close to one adjacent pixel opening 1001 corresponds to a side of the adjacent pixel opening 1001, and a side of the bottom of each of the first optical structures 200*a* close to one adjacent light-transmitting area 111 corresponds to a side of the adjacent cathode suppression layer 1035.

A first included angle α1 between a side surface 200*a*' of each of the first optical structures 200*a* and a plane of the display substrate 100 is 0° to 90°. For example, the first included angle α1 is 15°, 30°, 45°, 60°, 70°, 80°, or 90°.

In this embodiment, the first optical structures 200*a* have functions of increasing an amount of light incident in the light-transmitting areas 111 and increasing an amount of light emitted in a normal direction in first sub-pixels 13. Considering the above comprehensively, the first included angle α1 is greater than a threshold angle and less than or equal to 90°.

In this embodiment, because the refractive index of the second optical sub-layer 202 is greater than a refractive index of the first optical structures 200*a* (that is, the first optical sub-layer 201), an interface (that is, the side surface 200*a*') between each of the first optical structures 200*a* and the second optical sub-layer 202 is a total reflective surface. When external light is directed to a portion of the side surface 200*a*' of each of the first optical structures 200*a* close to one adjacent light-transmitting area 111, the external light is totally reflected on an outer surface of the side surface 200*a*', thereby changing a path of the external light. Therefore, the external light originally directed outside the light-transmitting areas 111 enters the light-transmitting areas 111 after being totally reflected, thereby increasing an amount of light incident in the light-transmitting areas 111 and increasing the light transmittance of the first display area 11.

Furthermore, when a light emitted by organic light-emitting layers 1033 is directed to a portion of the side surface 200*a*' of each of the first optical structures 200*a* close to one adjacent pixel openings 1001, the light is totally reflected on an outer surface of the side surface 200*a*', thereby changing a path of the light. In this way, the light originally emitted at the large viewing angle shifts to a normal viewing angle direction after being totally reflected, thereby increasing an amount of light emitted in a normal direction in the first sub-pixels 13 and improving the brightness difference between the first display area 11 and the second display area 12.

Accordingly, compared with the first embodiment, this embodiment can increase the light transmittance of the first display area, and increase the amount of the light emitted in the normal direction in the first sub-pixels in the first display area, thereby improving the brightness difference between the first display area and the second display area.

Fifth Embodiment

Figure 10:
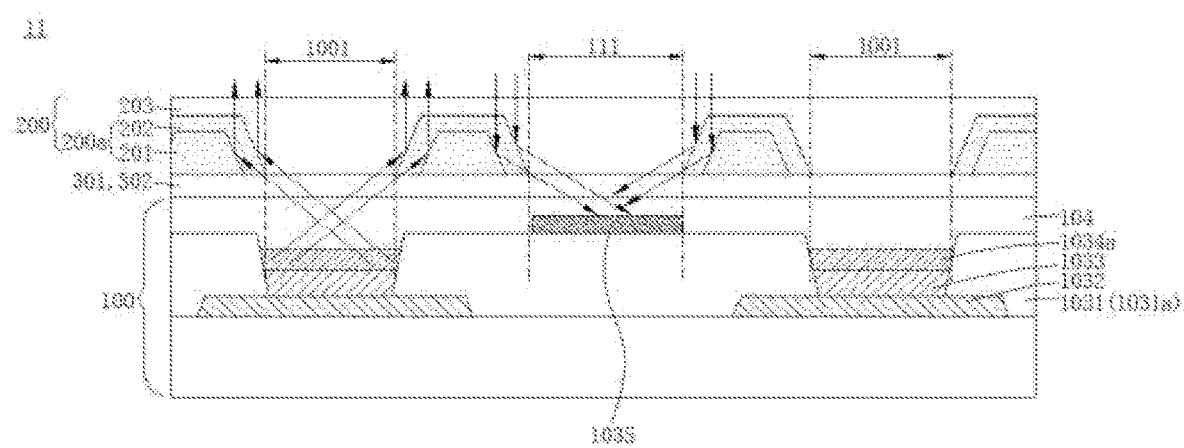
FIG. 10 is a schematic cross-sectional view of a first display area of a display panel according to a fifth embodiment of the present disclosure.

Please refer to FIG. 3 and FIG. 10, a structure of a display panel of this embodiment is similar to the structure of the display panel of the fourth embodiment. This embodiment differs from the fourth embodiment in that an optical layer 200 of the display panel of this embodiment comprises a plurality of optical sub-layers with different refractive indices, and at least two of the optical sub-layers form first optical structures 200*a*. Refractive indices of the optical sub-layers increase sequentially from a side close to a display substrate 100 to a side away from the display substrate 100. One optical sub-layer on a side away from the display substrate 100 covers one optical sub-layer on a side close to the display substrate 100, and the at least two optical sub-layers in the first optical structures 200*a* have a same cross-sectional shape in a direction perpendicular to the display substrate 100.

Please refer to FIG. 10 for details. For convenience of description, FIG. 10 only illustrates three optical sub-layers. The optical layer 200 comprises a first optical sub-layer 201, a second optical sub-layer 202, and a third optical sub-layer 203. A refractive index of the first optical sub-layer 201 is less than a refractive index of the second optical sub-layer 202, and the refractive index of the second optical sub-layer 202 is less than a refractive index of the third optical sub-layer 203. The first optical sub-layer 201 and the second optical sub-layer 202 constitute the first optical structures 200*a*, and the third optical sub-layer 203 covers the first optical structures 200*a*.

A structure of the display substrate 100 in the display panel of this embodiment is same as a structure of the display substrate 100 in the display panel of the first embodiment, and a structure of a second display area 12 of the display panel of this embodiment is same as the structure of the second display area 12 of the display panel of the first embodiment, which will not be described in detail herein.

In this embodiment, a side surface of each of the optical sub-layers in the first optical structures 200*a* may be formed as a total reflective surface. Therefore, on the basis of the fourth embodiment, this embodiment can further increase the light transmittance of the first display area and the amount of the light emitted in the normal direction in the first sub-pixels.

The present invention is described in detail above. The present disclosure uses specific examples to describe principles and embodiments of the present invention. The above description of the embodiments is only for helping to understand solutions of the present invention and its core ideas. Furthermore, those skilled in the art may make modifications to the specific embodiments and applications according to ideas of the present invention. In conclusion, the present specification should not be construed as a limitation to the present invention.

What is claimed is:

1. A display panel, comprising
   a first display area and a second display area surrounding the first display area, wherein a light transmittance of the first display area is greater than a light transmittance of the second display area, and the first display area comprises:
   a display substrate comprising a pixel defining layer and a cathode layer disposed on the pixel defining layer, wherein the pixel defining layer comprises a plurality of pixel openings spaced apart from each other and a plurality of supporting portions each disposed between two adjacent pixel openings; and an optical layer disposed on a side of the cathode layer away from the pixel defining layer, and comprising a plurality of first optical structures corresponding to the supporting portions, wherein each of the first optical structures comprises a first surface close to the cathode layer, a second surface opposite to the first surface, and a side surface that is a total reflective surface;

wherein the optical layer further comprises at least two optical sub-layers with different refractive indices, and at least one of the at least two optical sub-layers forms the first optical structures;

wherein the refractive indices of the at least two optical sub-layers decrease sequentially from a side close to the display substrate to a side away from the display substrate, and a width of the second surfaces of the first optical structures is greater than or equal to a width of the first surfaces of the first optical structures; and wherein the optical layer further comprises a plurality of second optical structures corresponding to the pixel openings, the second optical structures are disposed in a same layer as the first optical structures, and each of the second optical structures comprises a first surface close to the cathode layer, a second surface opposite to the first surface, and a side surface that is a total reflective surface.

2. The display panel according to claim 1, wherein a width of the second surfaces of the second optical structures is greater than or equal to a width of the first surfaces of the second optical structures.

3. The display panel according to claim 2, wherein the first optical structures or the second optical structures comprise at least two of the at least two optical sub-layers, one optical sub-layer on the side away from the display substrate covers one optical sub-layer on the side close to the display substrate, and the at least two optical sub-layers in the first optical structures or the second optical structures have a same cross-sectional shape in a direction perpendicular to the display substrate.

4. The display panel according to claim 2, wherein the cathode layer comprises a plurality of first cathode portions corresponding to the pixel openings and a plurality of second cathode portions corresponding to the supporting portions, and a thickness of the first cathode portions is greater than a thickness of the second cathode portions.

5. The display panel according to claim 4, wherein the display substrate further comprises:
a plurality of anode electrodes disposed corresponding to the first cathode portions;
a first auxiliary layer disposed on a side of each of the anode electrodes close to the cathode layer;
an organic light-emitting layer disposed on a side of the first auxiliary layer close to the cathode layer;
a second auxiliary layer disposed on a side of the organic light-emitting layer close to the cathode layer; and
a cathode suppression layer disposed on each of the supporting portions, wherein a thickness of the cathode suppression layer is less than a thickness of the cathode layer, an adhesion force between the cathode suppression layer and the cathode layer is less than an adhesion force between the cathode layer and the second auxiliary layer, and the cathode suppression layer is made of a transparent material.

6. The display panel according to claim 5, wherein an orthographic projection of the cathode suppression layers on the optical layer is separated from an orthographic projection of the anode electrodes on the optical layer.

7. The display panel according to claim 5, wherein an orthographic projection of the first optical structures on the display substrate overlaps with the cathode suppression layers.

8. The display panel according to claim 7, wherein a boundary of the first surface of each of the first optical structures corresponds to a boundary of one corresponding cathode suppression layer.

9. The display panel according to claim 4, wherein an orthographic projection of the second optical structures on the display substrate overlaps with the first cathode portions.

10. The display panel according to claim 4, wherein a width of the pixel openings is L, a height of the pixel openings is H, an included angle between the side surface and the first surface of each of the first optical structures is a first included angle, an included angle between the side surface and the first surface of each of the second optical structures is a second included angle, the first included angle and the second included angle are both greater than a threshold angle and less than or equal to 90°, and the threshold angle is arctan (H/L) *180°/T.

11. The display panel according to claim 10, wherein the first included angle is equal to the second included angle.

12. The display panel according to claim 10, wherein a boundary of the first surface of each of the second optical structures is located between a boundary of one corresponding pixel opening and a boundary beyond the boundary of the corresponding pixel opening by a predetermined distance, and the predetermined distance is a vertical distance from the pixel defining layer to the optical layer divided by a tangent value of the threshold angle.

13. The display panel according to claim 1, wherein the refractive indices of the at least two optical sub-layers increase sequentially from a side of the optical layer close to the display substrate to a side of the optical layer away from the display substrate, and a width of the second surfaces of the first optical structures is less than or equal to a width of the first surfaces of the first optical structures.

14. The display panel according to claim 13, wherein the cathode layer comprises a plurality of first cathode portions corresponding to the pixel openings and a plurality of second cathode portions disposed on the supporting portions, and a thickness of the first cathode portions is greater than a thickness of the second cathode portions.

15. The display panel according to claim 14, wherein the display substrate further comprises:
a plurality of anode electrodes disposed corresponding to the first cathode portions;
a first auxiliary layer disposed on a side of each of the anode electrodes close to the cathode layer;
an organic light-emitting layer disposed on a side of the first auxiliary layer close to the cathode layer;
a second auxiliary layer disposed on a side of the organic light-emitting layer close to the cathode layer; and
a cathode suppression layer disposed on each of the supporting portions, wherein a thickness of the cathode suppression layer is less than a thickness of the cathode layer, an adhesion force between the cathode suppression layer and the cathode layer is less than an adhesion force between the cathode layer and the second auxiliary layer, and the cathode suppression layer is made of a transparent material.

16. The display panel according to claim 15, wherein the first display area further comprises a plurality of light-transmitting areas each disposed between two adjacent pixel openings, an orthographic projection of each of the first optical structures on the display substrate is located between one of the pixel openings and one of the light-transmitting areas.

17. The display panel according to claim 16, wherein a side of the first surface of each of the first optical structures close to one adjacent pixel opening corresponds to a side of the adjacent pixel opening, and a side of the first surface of each of the first optical structures close to one adjacent light-transmitting area corresponds to a side of the adjacent cathode suppression layer.

\* \* \* \* \*